United States Patent [19]

Tanski et al.

[11] Patent Number: 4,990,814
[45] Date of Patent: Feb. 5, 1991

[54] SEPARATED SUBSTRATE ACOUSTIC CHARGE TRANSPORT DEVICE

[75] Inventors: William J. Tanski, Glastonbury; Donald E. Cullen, Manchester, both of Conn.

[73] Assignee: United Technologies Corporation, Hartford, Conn.

[21] Appl. No.: 434,230

[22] Filed: Nov. 13, 1989

[51] Int. Cl.⁵ .............................................. H01L 41/08
[52] U.S. Cl. ............................. 310/313 R; 310/313 D
[58] Field of Search .................... 310/313 R, 313 D; 333/150, 153, 154, 193, 195

[56] References Cited

U.S. PATENT DOCUMENTS

| | | | |
|---|---|---|---|
| 4,016,412 | 4/1977 | Stern et al. | 310/313 R X |
| 4,055,758 | 10/1977 | Stern et al. | 310/313 R X |
| 4,066,984 | 1/1978 | Stern et al. | 310/313 R X |
| 4,101,965 | 7/1978 | Ingebrigtsen et al. | 310/313 R X |
| 4,122,495 | 10/1978 | Defranould et al. | 310/313 B X |
| 4,380,864 | 4/1983 | Das | 310/313 R X |
| 4,600,853 | 7/1986 | Whitlock et al. | 310/313 R X |
| 4,611,140 | 9/1986 | Whitlock et al. | 310/313 R X |
| 4,884,001 | 11/1989 | Sacks et al. | 310/313 R X |
| 4,926,083 | 5/1990 | Merritt et al. | 310/313 R |

*Primary Examiner*—Mark O. Budd
*Attorney, Agent, or Firm*—McCormick, Paulding & Huber

[57] ABSTRACT

A separated substrate acoustic charge transport device includes a surface acoustic wave (SAW) element fabricated on a piezoelectric substrate and an acoustic charge transport element fabricated on a separate semiconducting substrate. The substrates are separated by a small gap such that the evanescent electric field associated with the propagating SAW wave extends into a transport channel in the acoustic charge transport element to provide for longitudinal charge confinement and transport along the transport channel.

11 Claims, 2 Drawing Sheets

SEPARATED SUBSTRATE ACOUSTIC CHARGE TRANSPORT DEVICE

TECHNICAL FIELD

This invention relates to charge transport devices and more particularly to devices having an acoustic charge transport element coupled with a surface acoustic wave element formed in a separate substrate.

CROSS-REFERENCE TO RELATED APPLICATIONS

Some of the subject matter hereof is disclosed and claimed in the commonly owned, co-pending U.S. patent applications entitled "A Monolithic Electro-Acoustic Device Having An Acoustic Charge Transport Device Integrated With A Transistor", Ser. No. 283,625, "Optically Modulated Acoustic Charge Transport Device", Ser. No. 283,624 and "Acoustic Charge Transport Device Having Direct Optical Input", Ser. No. 283,618, each of which is incorporated herein by reference.

BACKGROUND OF THE INVENTION

Acoustic charge transport (ACT) phenomena in III-IV semiconductor material has only recently been demonstrated. Such devices have applications as high speed analog signal processors. Delay lines have been fabricated in gallium arsenide (GaAs) substrates comprising a surface acoustic wave (SAW) transducer that launches a surface acoustic wave along an upper layer of the GaAs substrate having a transport channel formed therein. An input electrode sources charge to be transported by the propagating potential wells. A Schottky electrode receives a signal for modulating that charge. Spaced down the transport channel are often one or more non-destructive sensing (NDS) electrodes for sensing the propagating charge. Finally, there is an ohmic output electrode for removing the charge.

Initial acoustic charge transport devices comprised a thick epilayer (TE-ACT), with vertical charge confinement has been accomplished by means of an electrostatic DC potential applied to metal field plates on the top and bottom surfaces of the GaAs substrate. The field plate potentials are adjusted to fully deplete the epilayer and produce a potential maximum near the midpoint thereof. Consequently, any charge injected into the channel is confined to the region of maximum DC potential. Those skilled in the art will note that a TE-ACT separated substrate device similar to one provided by the present invention cannot be made since a top field plate would short out the electric field associated with the SAW wave in a TE-ACT substrate, and any external electric fields as well.

Lateral charge confinement (Y direction) has been achieved in several ways. Typically, a mesa is formed to define a charge transport channel. However, for thick epilayer acoustic transport devices, the mesa must be several microns in height, a fact which presents problems in fabrication and is a major impediment to the monolithic integration of conventional MESFET electronics. The rather tall (approximately 5 microns) mesa makes subsequent lithography almost impossible. Blocking potentials extending down both sides of the delay line have also been used to define the transverse extent of the channel, as has proton bombardment to render the material surrounding the channel semi-insulating.

Recently, a heterostructure acoustic charge transport (HACT) device has been fabricated using a GaAs/AlGaAs heterostructure that is similar to that of quantum well lasers and heterostructure field effect transistors (FET). A HACT device vertically confines mobile carriers through the placement of potential steps that result from band structure discontinuities. Besides providing for inherent vertical charge confinement, the HACT devices are thin film devices whose layers have a total thickness of approximately 0.25 microns, excluding a buffer layer.

HACT delay lines are characterized by a limited length due to the relatively high level of acoustic attenuation in gallium arsenide structures when compared to the length of structures fabricated in lithium niobate ($LiNbO_3$) or quartz ($SiO_2$), the piezoelectric substrates traditionally used for delay line applications. It would be advantageous to have an acoustic charge transport device capable of use in delay line applications displaying an increased time-bandwidth product and further capable of simplified fabrication. The present device is drawn towards such an invention.

SUMMARY OF THE INVENTION

An object of the present invention is to provide an acoustic charge transport device having piezoelectric and semi-conducting characteristics optimized on two separated substrates.

According to the present invention, a separated substrate charge transport device includes an acoustic charge transport element formed in a major surface of a semiconducting substrate. The semiconducting element has a charge transport channel formed in the semiconducting substrate to have a major dimension extend along the substrate major surface. The transport channel is for receiving electrical charges and providing lateral and vertical confinement thereof. A first electrode is formed on the semiconducting substrate surface and injects electrical charges into the transport channel. A second electrode is formed on the semiconducting substrate surface to be electrically configured with said transport channel. The second electrode receives modulation signals that alter an electrical potential barrier height in the transport channel in accordance with the modulation signals. A third electrode is configured with said transport channel for sensing the injected charge and generating an electrical signal indicative thereof. A fourth electrode is configured with the transport channel at an end thereof distal to the first electrode means for electrically removing the injected charge. The device also includes a surface acoustic wave (SAW) element formed on a major surface of a piezoelectric substrate. The SAW element has a transducer formed in the SAW element major surface for launching along a propagation axis surface acoustic waves characterized by an evanescent electric field extending outward from the piezoelectric substrate surface. A spacer is adapted to receive at opposed ends thereof the semiconducting and piezoelectric substrates, respectively. The spacer locates the substrates such that the major substrate surfaces oppose one another and the evanescent electric field penetrates the charge transport channel, allowing the injected charge to propagate with the surface acoustic waves.

DESCRIPTION OF THE PREFERRED EMBODIMENT

Figure 1:
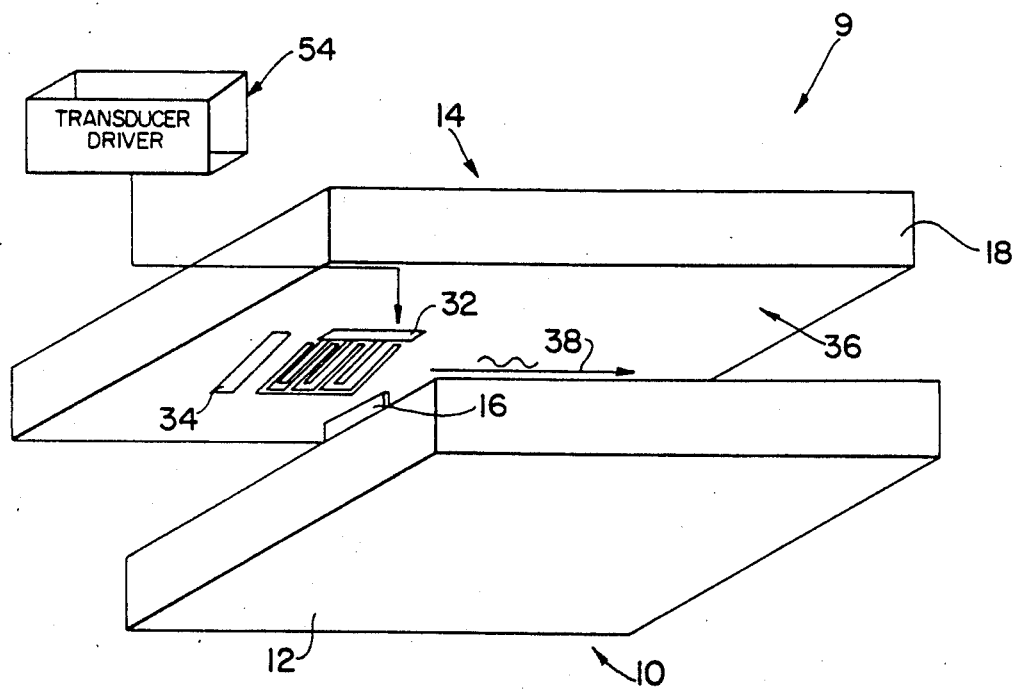
FIG. 1 is an exploded perspective illustration of an electrical circuit having a separated substrate acoustic charge transport device provided according to the present invention.

Referring now to FIG. 1, there is a schematic illustration of a circuit 9 having a separated substrate acoustic charge transport device provided according to the present invention. The device 10 includes an acoustic charge transport element 12 and surface acoustic wave (SAW) element 14 located with respect to one another by spacers 16.

The surface acoustic wave (SAW) element 14 is comprised of a piezoelectric substrate 18 of known material such as lithium niobate ($LiNbO_3$) or quartz. The acoustic charge transport device 12 is preferably comprised of a semiconducting material, such as GaAs and AlGaAs. These III-IV materials are very closely lattice matched, having lattice parameters that differ by less than 0.04%. As a result, their ternary solutions are nearly ideal for preparation by epitaxial growth. In addition, the energy band gap of an AlGaAs compound ($Al_xGa_{1-x}As$) increases monotonically with the parameter x, up to x approximately equal to 0.4, at which point the band gap of the ternary becomes indirect. Conduction band potential steps as large as 0.3 ev can be obtained in a heterostructure device.

For acoustic charge transport, the element 12 provides vertical charge confinement through formation of a potential well within a GaAs/AlGaAs layered structure using the differences in the conduction band energies of select contiguous layers. No applied potentials are required for charge confinement in the vertical direction in the element 12. Moreover, the heterojunction band structure potential is a property of the composite material alone and is not diminished by the transport charge load.

Figure 2:
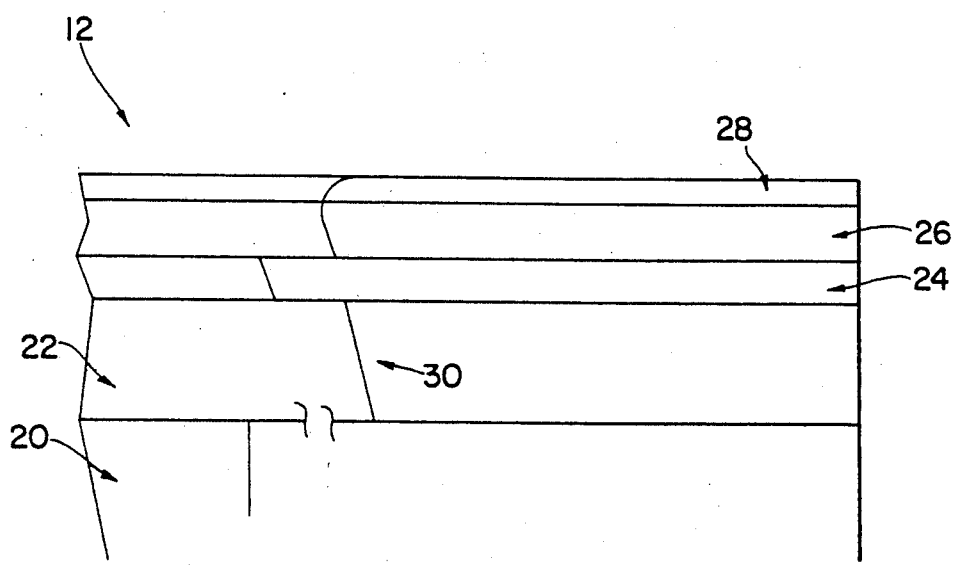
FIG. 2 is a diagrammatic illustration showing conduction band potential across several material layers in a semiconducting element in the device of FIG. 1.

Referring now to FIG. 2, there is shown a sectioned diagrammatic illustration showing conduction band potential across the material layers in the device of FIG. 1. On a semi-insulating GaAs substrate 20 there is formed an (AlGa)As or GaAs unintentionally doped layer buffer 22. The buffer layer receives a 40 mm thick layer 24 of GaAs which forms the first transport channel. An unintentionally doped change control layer 26 of (AlGa)As is then grown on layer 24 and a second upper layer 28 of (AlGa)As is subsequently grown on the layer 26 with a doping of $2 \times 10^{17}$. Preferably, the charge control layer 26 is 700 A in thickness.

As indicated by the conduction band potential 30 of GaAs layers 24 and (AlGa)As layers 22 and 26, a potential well 0.25 ev deep is created in the GaAs layer 24 which serves to confine the charge in the first transport channel. The thickness and doping level of the (AlGa)As layer 26 is designed to provide a sufficient number of electrons to fill the surface states therein while leaving the remainder of the structure essentially free of excess carriers. In the device of FIG. 1, a mole fraction of 32% aluminum was used in the layers. As noted above, the heterostructure described with respect to FIG. 2 provides for vertical charge confinement and eliminates the need for backgating consideration and external biasing, as is necessary for conventional acoustic charge transport devices.

The transport channel formed in the element 12 differs from a double heterostructure FET device in that the charge in a FET transistor is supplied by donors in the (AlGa)As layers. However, with the present invention, the transport channel is initially empty and charges are pulled into the transport channel through an ohmic contact by the surface acoustic wave potential. The transport channel is undoped to provide high electron mobility, and there is an increased charge transfer efficiency due to a limited charge packet volume and lower bulk charge trapping.

Referring again to FIG. 1, the SAW element 14 includes the piezoelectric substrate 18 with surface acoustic wave transducer 32 and reflector 34. The transducer is formed in a known manner and preferably comprises an interdigitated (IDT) transducer of aluminum copper alloy deposited on surface 36. Similarly, the reflector comprises a plurality of etched grooves or metal strips formed in a known manner to reflect the surface acoustic wave along the surface 36 along a propagation axis 38. Those skilled in the art will note that certain piezoelectric substrate materials are characterized by such strong coupling that a reflector is not needed.

Figure 4:
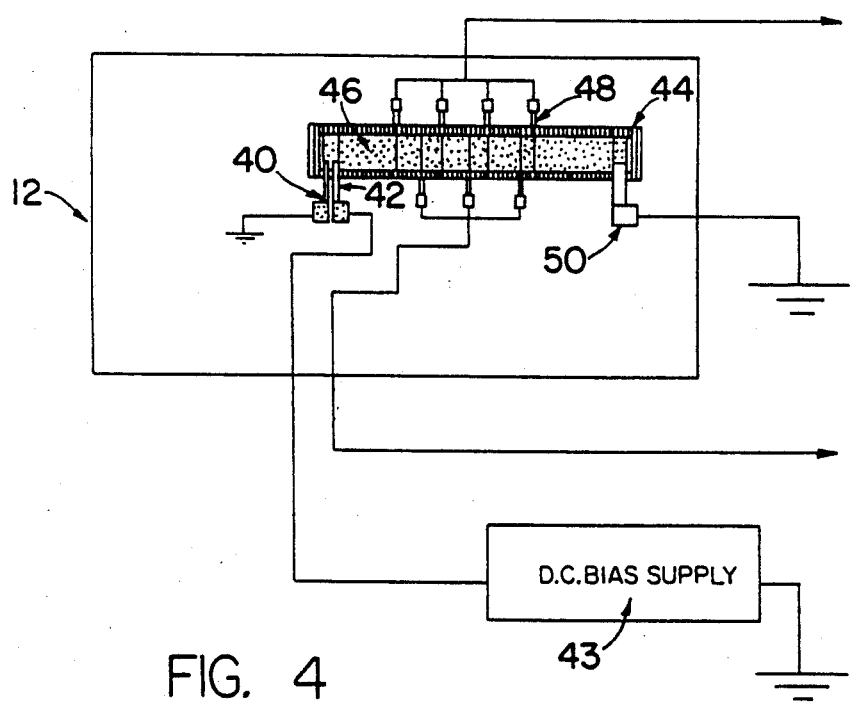
FIG. 4 is a top planar view of the semiconducting element of the device of FIG. 1.

Fabricated on the semiconducting substrate is an input ohmic electrode 40 for injecting charge, as shown in FIG. 4. The charge is received by the surface acoustic wave in potential wells and is propagated along the device in transport channel 46. The potential barrier height controls the maximum amount of propagating charge and is modulated in accordance with signals provided at the input Schottky electrode 42 from DC bias supply 43. Lateral confinement of the propagating charge is preferably accomplished by mesa isolation to produce a semi-insulating area 44 surrounding transport channel 46 on the surface. A plurality of non-destructive sensing electrodes 48 are fabricated along the length of the transport channel for sensing the modulated charge as it propagates therealong. The charge is extracted from the device at the output ohmic electrode 50.

Figure 3:
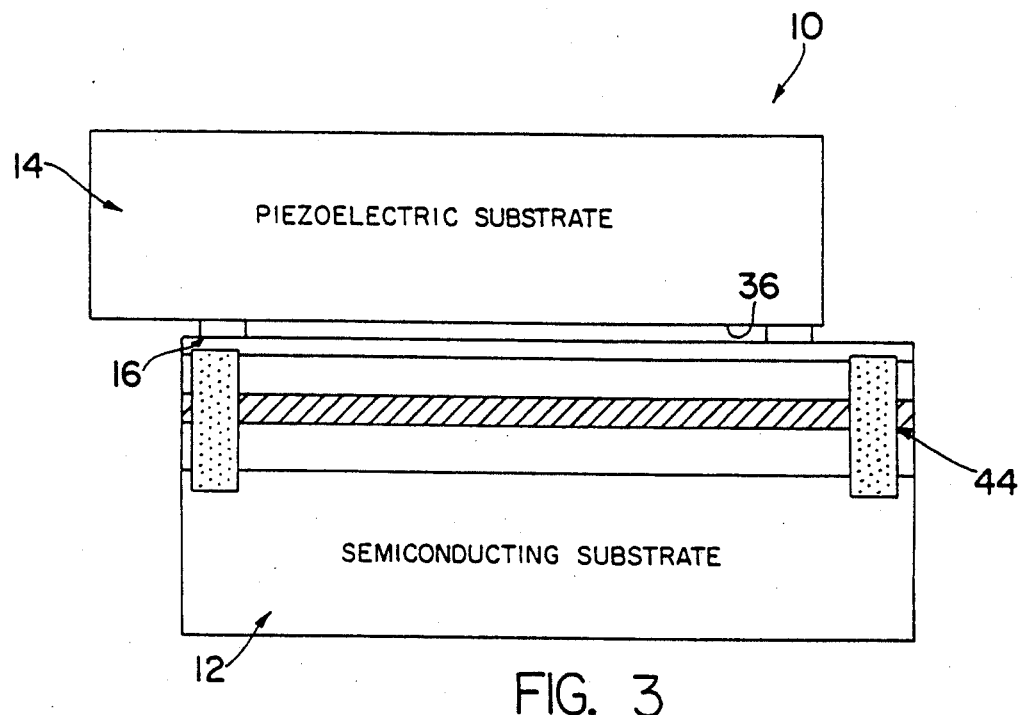
FIG. 3 is a sectioned illustration of the device of FIG. 1.

As seen in FIG. 3, the device 10 also includes a plurality of spacers 16 which can be any of a known type, including raised ridges etched in the major surface of either element 12 or 14. The ridges are fabricated to locate the opposed surfaces with an air gap therebetween on the order of 0.2 microns such that the evanescent electric field associated with the propagating SAW wave extends across the air gap. The size of the air gap is critical to the operation of the device. Since the evanescent electric field strength diminishes rapidly outside of the surface 36, even small variations in the air gap will result in strong variations in the SAW amplitude in the charge transport region. For certain applications it is desirable to spring load the element 14 to the element 12 to ensure that variations in air gap magnitude are eliminated. The SAW element is mis-registered with respect to the acoustic charge transport element as shown by an amount sufficient to enable electrical connections to the transducer. The extent of insulating area 44 is also shown in FIG. 3.

Besides the device 10, circuit 9 includes a transducer driver 54 for providing electrical signals which are transduced into the surface acoustic waves launched along the SAW element substrate surface. The acoustic charge transport element is positioned with respect to the surface acoustic wave element so that the major surfaces of each element containing the above electronic structure are opposed, with the propagation axis 38 approximately parallel to the length of the transport channel. Consequently, surface acoustic waves are launched along the propagation axis 38 with the associated evanescent electric field extending across the air gap and into the transport channel such that electric charge injected therein will be transported therealong. In the preferred embodiment, the amount of desired delay can be selected in accordance with a particular one of the non-destructive sense electrodes. A device provided according to the present invention allows the optimum selection of materials (piezoelectric and semiconducting) to provide devices with the maximum delay and dynamic range. Since each element is of a separate substrate, the material selection can be optimized independent of the other substrate. Moreover, fabrication is simplified and can be accomplished without regard to the other element's particular fabrication requirements.

The present invention provides a device which uses the evanescent SAW potential from a strongly piezoelectric delay line to confine and transport charge in an adjacent semiconducting device structure in a manner similar to the confinement and transport mechanism in charge coupled devices (CCD). Prior art separated substrate devices have simply sensed an evanescent field and applied this electric potential to a MOSFET transistor in a silicon substrate. In a second known device, two counter propagating SAW waves produced evanescent electric fields which interact in a highly nonlinear fashion in an adjacent silicon substrate producing an output signal when the two SAW waves match in phase; in essence the device is a type of convolver. Neither of these devices hint or suggest at a device such as provided by the present invention which both confines and transports electric charge by an evanescent electric field originating in an adjacent piezoelectric substrate. The present invention is the first which recognizes that high quality GaAs/(Al,Ga)As layers and interfaces can be used to vertically confine charge and transport that charge as detailed above with high transfer efficiency.

Similarly, although the invention has been shown and described with respect to a preferred embodiment thereof, it should be understood by those skilled in the art that various other changes, omissions and additions thereto may be made therein without departing from the spirit and scope of the present invention. For example, the substrate can be indium phosphide, (InP), with lattice matched epitaxial layers of indium gallium arsenide, (InGa)As, and indium aluminum arsenide (InAl)As fabricated thereon to correspond to charge transport and confinement layers in a manner similar to the material layers detailed hereinabove.

We claim:

1. A separated substrate charge transport device comprising:
    an acoustic charge transport element formed in a major surface of a semiconducting substrate, including
    a charge transport channel formed in said semiconducting substrate to have a major dimension extending along said substrate major surface, said channel for receiving electrical charges and providing lateral and vertical confinement thereof;
    a first electrode means formed on said semiconducting substrate surface for injecting electrical charges into said transport channel;
    a second electrode means formed on said semiconducting substrate surface and electrically configured with said transport channel for receiving modulation signals and altering an electrical potential barrier height in said transport channel in accordance with said modulation signals;
    a third electrode means configured with said transport channel for sensing said injected charge and generating an electrical signal indicative thereof;
    a fourth electrode means configured with said transport channel at an end thereof distal to said first electrode means for electrically removing said injected charge; and
    a surface acoustic wave (SAW) element formed on a major surface of a piezoelectric substrate, said SAW element including a transducer means formed in said SAW element major surface for launching along a propagation axis surface acoustic waves characterized by an evanescent electric field extending outward from said piezoelectric substrate surface; and
    a spacer means adapted to receive at opposed ends thereof said semiconducting and piezoelectric substrates, respectively, said spacer means for locating said substrates such that said major substrate surfaces oppose one another and said evanescent electric field penetrates said charge transport channel allowing said injected charge to propagate with said surface acoustic waves.

2. The device of claim 1 further comprising a reflector means formed in said SAW element major surface at an end thereof adjacent to said transducer means for reflecting said surface acoustic waves.

3. The device of claim 1 wherein said semiconducting substrate comprises Group III-V material.

4. The device of claim 1 wherein said piezoelectric substrate comprises lithium niobate (LiNbO$_3$).

5. The device of claim 1 wherein said acoustic charge transport element comprises a heterostructure acoustic charge transport device wherein said semiconducting element includes an unintentionally doped first aluminum-gallium arsenide layer grown on said semiconducting substrate, an unintentionally doped first gallium arsenide layer grown on said aluminum-gallium arsenide layer and a doped second aluminum-gallium arsenide layer grown on said unintentionally doped gallium arsenide layer.

6. The device of claim 1 wherein said structure further comprises an unintentionally doped second gallium arsenide layer.

7. The device of claim 1 wherein said third electrode means comprises a plurality of non-destructive sensing electrodes spaced along said transport channel.

8. The device of claim 1 wherein said acoustic charge transport element further comprises a mesa region encompassing said transport channel for providing lateral confinement of said propagating charge.

9. An electrical circuit having a separated substrate acoustic charge transport device, comprising:
    an acoustic charge transport element formed in a major surface of a semiconducting substrate, including a charge transport channel formed in said semiconducting substrate to have a major dimension extending along said substrate major surface, said channel for receiving electrical charges and providing lateral and vertical confinement thereof;

a first electrode means formed on said semiconducting substrate surface for injecting electrical charges into said transport channel;

a second electrode means formed on said semiconducting substrate surface and electrically configured with said transport channel for receiving modulation signals and altering an electrical potential barrier height in said transport channel in accordance with said modulation signals;

a third electrode means configured with said transport channel for sensing said injected charge and generating an electrical signal indicative thereof;

a fourth electrode means configured with said transport channel at an end thereof distal to said first electrode means for electrically removing said injected charge; and a surface acoustic wave (SAW) element formed on a major surface of a piezoelectric substrate, said SAW element including a transducer means formed in said SAW element major surface for launching along a propagation axis surface acoustic waves characterized by an evanescent electric field extending outward from said piezoelectric substrate surface; and a spacer means adapted to receive at opposed ends thereof said semiconducting and piezoelectric substrates, respectively, said spacer means for locating said substrates such that said major substrate surfaces oppose one another and said evanescent electric field penetrates said charge transport channel allowing said injected charge to propagate with said surface acoustic waves a means for supplying said modulation signals; and a transducer driver means for supplying to said transducer means electrical signals corresponding to said surface acoustic waves.

10. The circuit of claim 9 wherein said signals output from said third electrode comprise said gate control signals.

11. The circuit of claim 1 wherein said acoustic charge transport element comprises an indium phosphide (InP) substrate on which is grown a indium gallium arsenide, (InGa)As, structure having an electronic band gap characteristic which provides vertical confinement of electronic charge.

* * * * *